US012566232B2

(12) United States Patent
Gao et al.

(10) Patent No.: US 12,566,232 B2
(45) Date of Patent: Mar. 3, 2026

(54) MAGNETIC RESONANCE IMAGING SYSTEM AND METHOD

(71) Applicant: GE Precision Healthcare LLC, Waukesha, WI (US)

(72) Inventors: Lei Gao, Beijing (CN); Yongchuan Lai, Beijing (CN)

(73) Assignee: GE Precision Healthcare LLC, Waukesha, WI (US)

( * ) Notice: Subject to any disclaimer, the term of this patent is extended or adjusted under 35 U.S.C. 154(b) by 213 days.

(21) Appl. No.: 18/632,101

(22) Filed: Apr. 10, 2024

(65) Prior Publication Data

US 2024/0345195 A1 Oct. 17, 2024

(30) Foreign Application Priority Data

Apr. 11, 2023 (CN) .......................... 202310388930.8

(51) Int. Cl.
*G01R 33/563* (2006.01)
*G01R 33/48* (2006.01)
*G01R 33/561* (2006.01)

(52) U.S. Cl.
CPC ... *G01R 33/56341* (2013.01); *G01R 33/4818* (2013.01); *G01R 33/5616* (2013.01)

(58) Field of Classification Search
CPC .......... G01R 33/56341; G01R 33/4818; G01R 33/5616; G01R 33/54; A61B 5/055
See application file for complete search history.

(56) References Cited

U.S. PATENT DOCUMENTS 11,119,175 B2 9/2021 Gao
2023/0168324 A1* 6/2023 Gao ................... G01R 33/5611

* cited by examiner

*Primary Examiner* — G.M. A Hyder

(57) ABSTRACT

A magnetic resonance imaging system and method is provided. The magnetic resonance imaging method comprises: in a single signal acquisition, applying a plurality of diffusion-weighted imaging sequences in a plurality of diffusion directions, respectively, to acquire a plurality of k-space data sets. Each diffusion-weighted imaging sequence comprising a pre-dephasing gradient pulse and a plurality of phase encoding gradient pulses applied after the pre-dephasing gradient pulse, and the pre-dephasing gradient pulses in the plurality of diffusion-weighted imaging sequences, when sorted according to area values, successively having a first standard area difference determined on the basis of the number of the plurality of diffusion directions. The method further includes performing data fusion processing on the plurality of k-space data sets in the single signal acquisition to obtain a magnetic resonance image.

12 Claims, 12 Drawing Sheets

Figure 3:
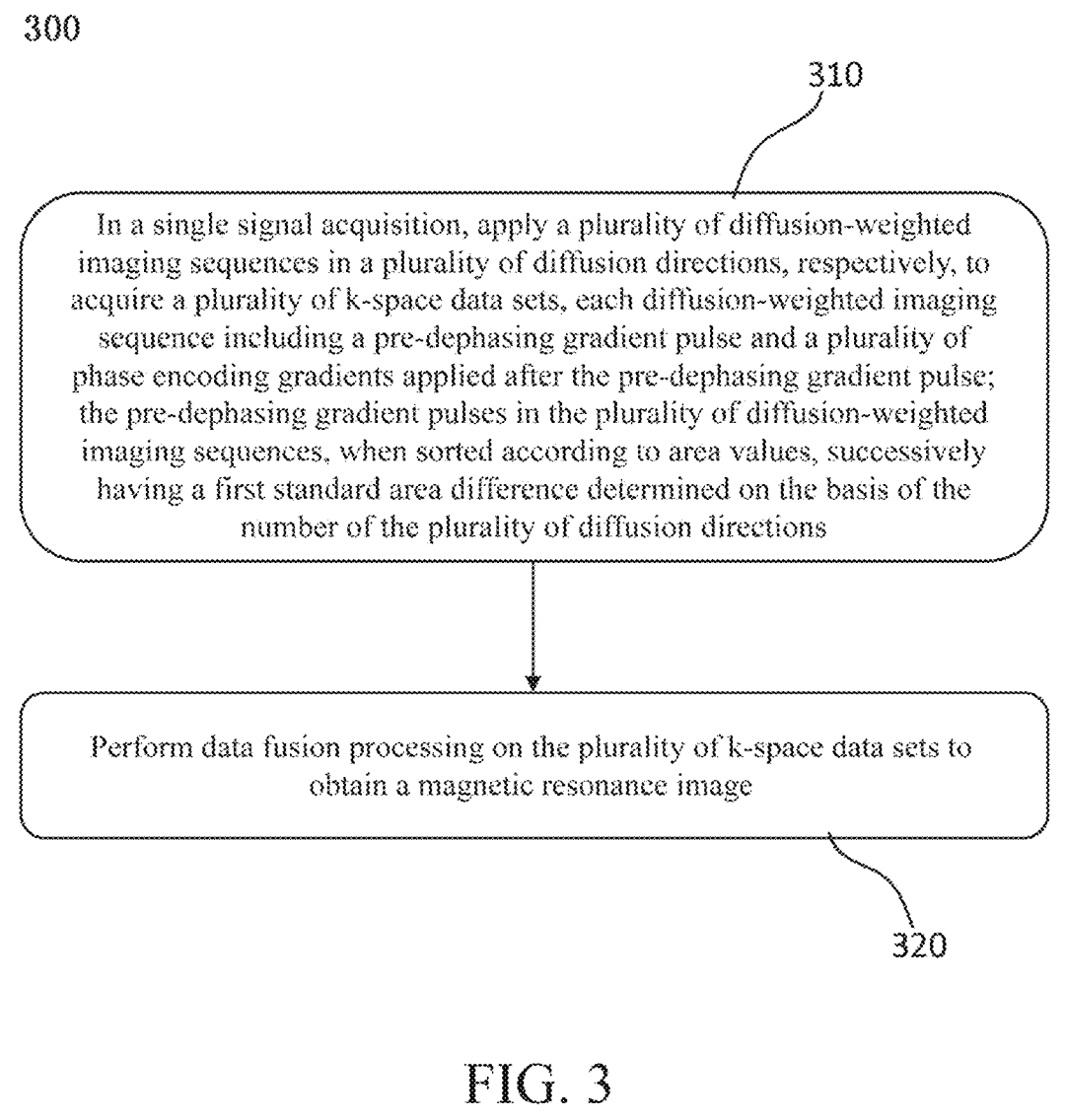

300

310

In a single signal acquisition, apply a plurality of diffusion-weighted imaging sequences in a plurality of diffusion directions, respectively, to acquire a plurality of k-space data sets, each diffusion-weighted imaging sequence including a pre-dephasing gradient pulse and a plurality of phase encoding gradients applied after the pre-dephasing gradient pulse; the pre-dephasing gradient pulses in the plurality of diffusion-weighted imaging sequences, when sorted according to area values, successively having a first standard area difference determined on the basis of the number of the plurality of diffusion directions Perform data fusion processing on the plurality of k-space data sets to obtain a magnetic resonance image

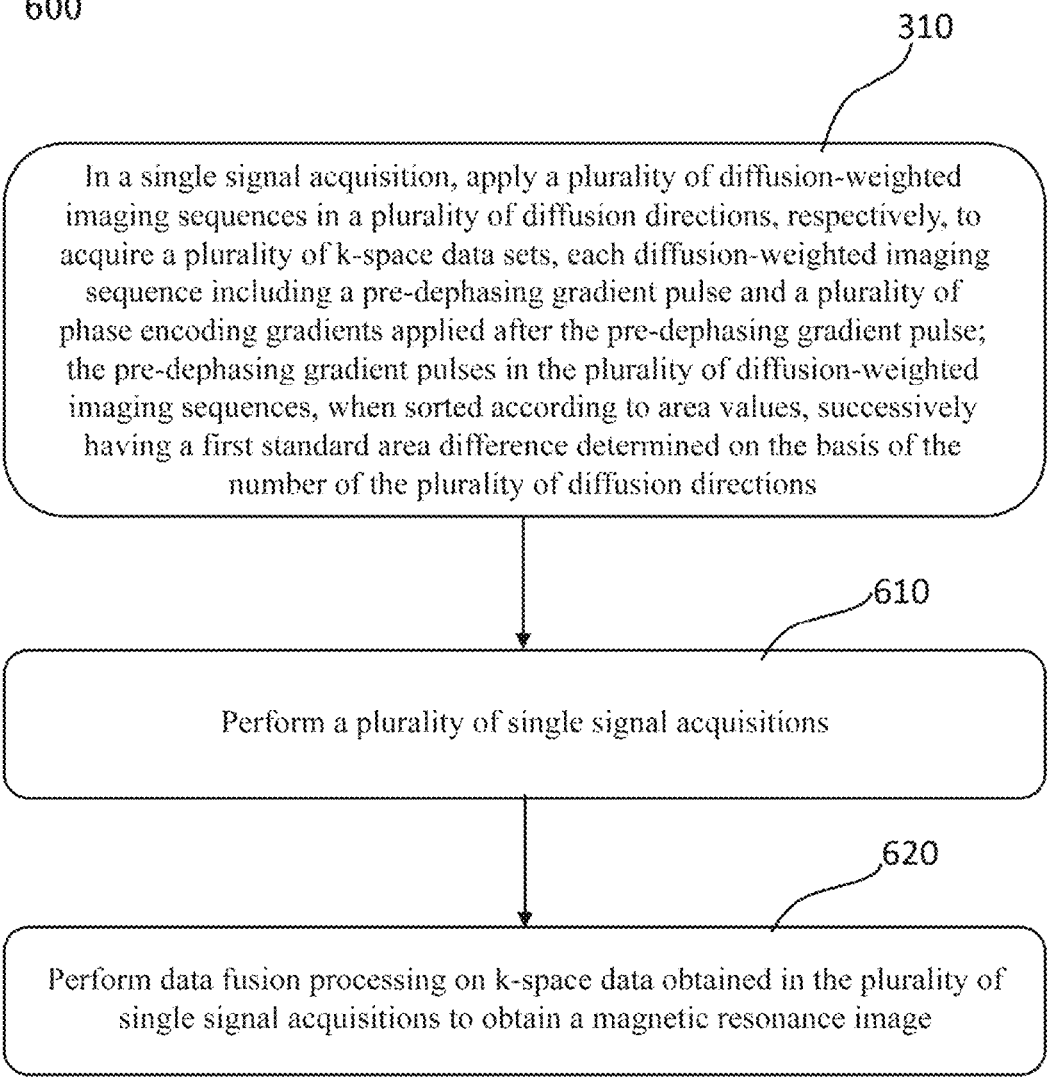

In a single signal acquisition, apply a plurality of diffusion-weighted imaging sequences in a plurality of diffusion directions, respectively, to acquire a plurality of k-space data sets, each diffusion-weighted imaging sequence including a pre-dephasing gradient pulse and a plurality of phase encoding gradients applied after the pre-dephasing gradient pulse; the pre-dephasing gradient pulses in the plurality of diffusion-weighted imaging sequences, when sorted according to area values, successively having a first standard area difference determined on the basis of the number of the plurality of diffusion directions

610

Perform a plurality of single signal acquisitions

620

Perform data fusion processing on k-space data obtained in the plurality of single signal acquisitions to obtain a magnetic resonance image

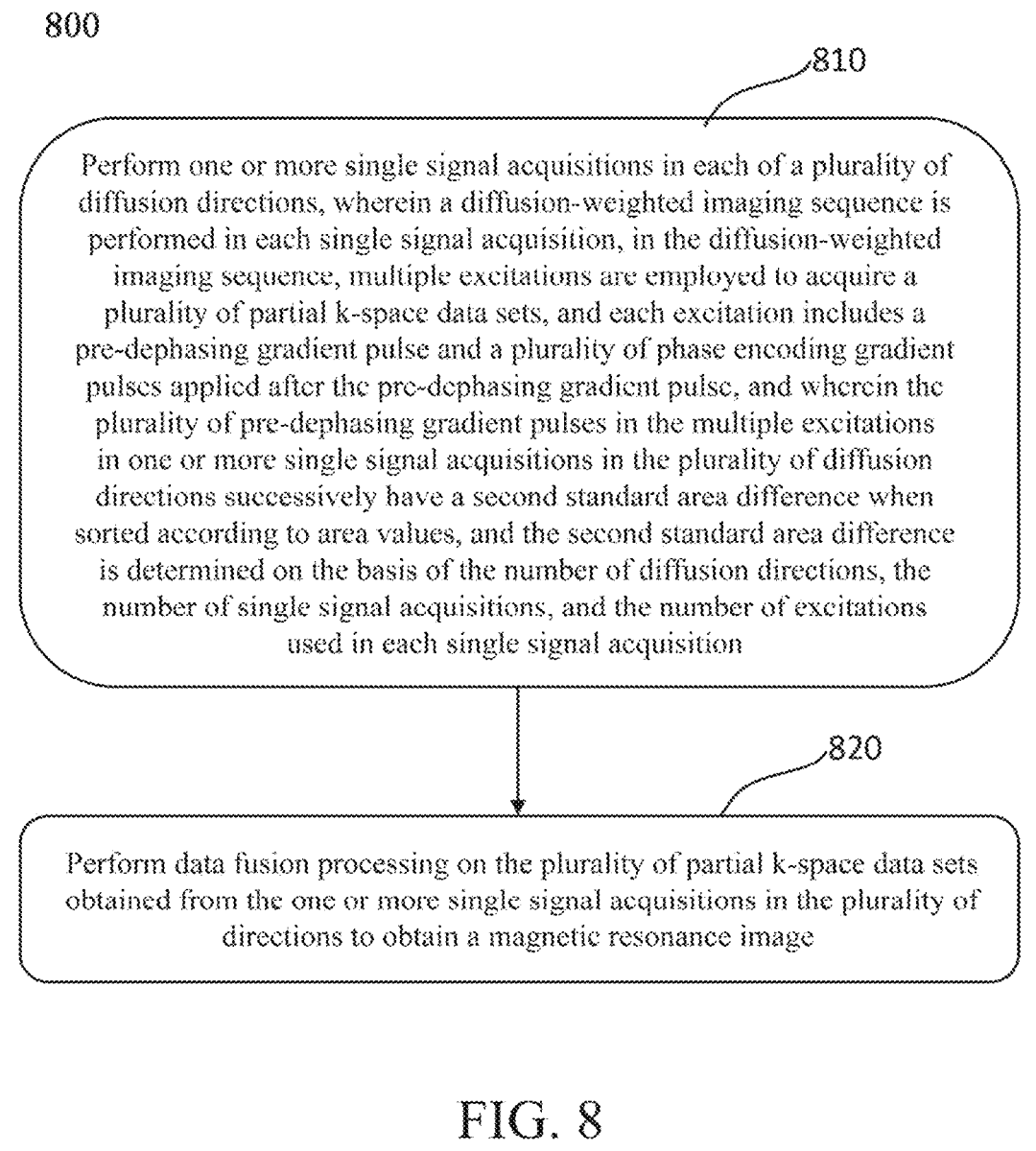

Perform one or more single signal acquisitions in each of a plurality of diffusion directions, wherein a diffusion-weighted imaging sequence is performed in each single signal acquisition, in the diffusion-weighted imaging sequence, multiple excitations are employed to acquire a plurality of partial k-space data sets, and each excitation includes a pre-dephasing gradient pulse and a plurality of phase encoding gradient pulses applied after the pre-dephasing gradient pulse, and wherein the plurality of pre-dephasing gradient pulses in the multiple excitations in one or more single signal acquisitions in the plurality of diffusion directions successively have a second standard area difference when sorted according to area values, and the second standard area difference is determined on the basis of the number of diffusion directions, the number of single signal acquisitions, and the number of excitations used in each single signal acquisition

820

Perform data fusion processing on the plurality of partial k-space data sets obtained from the one or more single signal acquisitions in the plurality of directions to obtain a magnetic resonance image

FIG. 8

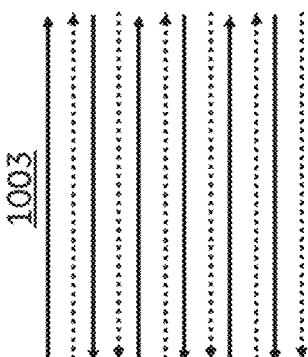
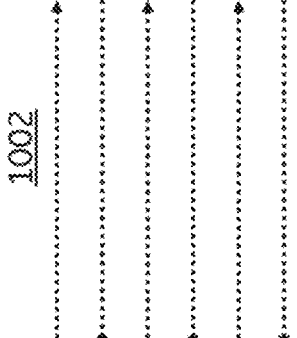
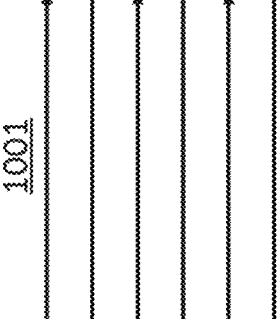
FIG. 10

MAGNETIC RESONANCE IMAGING SYSTEM AND METHOD

CROSS REFERENCE TO RELATED APPLICATIONS

The present application claims priority and benefit of Chinese Patent Application No. 202310388930.8 filed on Apr. 11, 2023, which is incorporated herein by reference in its entirety.

TECHNICAL FIELD

The present invention relates to the field of medical imaging, and in particular to a magnetic resonance imaging (MRI) system and method and a computer-readable storage medium.

BACKGROUND

Conventional magnetic resonance echo plane imaging (EPI) is a fast imaging technology in which an entire image can be formed from a plurality of echo signals generated by a single radio-frequency (RF) excitation, thus enabling fast imaging. However, this imaging technology is prone to Nyquist artifacts, which can be caused by factors such as eddy currents, gradient coil heating, gradient delays, etc. In addition, since an acceleration technique of parallel imaging is usually implemented at the same time in EPI, acceleration artifacts appear in edge regions of images.

Some methods for suppressing Nyquist artifacts or acceleration artifacts have been proposed in the prior art, but it is difficult to suppress these two different types of artifacts at the same time, and the effects of suppressing the artifacts need to be further improved.

SUMMARY

An aspect of the present invention provides a magnetic resonance imaging method, the method comprising: in a single signal acquisition, applying a plurality of diffusion-weighted imaging sequences in a plurality of diffusion directions, respectively, to acquire a plurality of k-space data sets. Each diffusion-weighted imaging sequence comprises a pre-dephasing gradient pulse and a plurality of phase encoding gradient pulses applied after the pre-dephasing gradient pulse, and the pre-dephasing gradient pulses in the plurality of diffusion-weighted imaging sequences, when sorted according to area values, successively having a first standard area difference determined on the basis of the number of the plurality of diffusion directions. The method further comprises performing data fusion processing on the plurality of k-space data sets in the single signal acquisition to obtain a magnetic resonance image.

Another aspect of the present invention further provides a magnetic resonance imaging method, comprising: performing one or more single signal acquisitions in each of a plurality of diffusion directions, wherein a diffusion-weighted imaging sequence is performed in each single signal acquisition. In the diffusion-weighted imaging sequence, multiple excitations are employed to acquire a plurality of partial k-space data sets, and each excitation comprises a pre-dephasing gradient pulse and a plurality of phase encoding gradient pulses applied after the pre-dephasing gradient pulse. The plurality of pre-dephasing gradient pulses in the multiple excitations of the one or more single signal acquisitions in the plurality of diffusion directions successively have a second standard area difference when sorted according to area values. Further, the second standard area difference is determined on the basis of the number of the diffusion directions, the number of the single signal acquisitions, and the number of excitations of the diffusion-weighted imaging sequence used in each single signal acquisition. The method further comprises performing data fusion processing on the plurality of partial k-space data sets obtained from the one or more single signal acquisitions in the plurality of directions to obtain a magnetic resonance image.

Another aspect of the present invention further provides a magnetic resonance imaging system, comprising: a gradient coil used to generate a gradient pulse; a radio-frequency coil used to generate a radio-frequency pulse; and a processor used to control timings of the gradient coil and the radio-frequency coil to generate the gradient pulse and the radio-frequency pulse, so as to perform a method. The method includes in a single signal acquisition, applying a plurality of diffusion-weighted imaging sequences in a plurality of diffusion directions, respectively, to acquire a plurality of k-space data sets, each diffusion-weighted imaging sequence comprising a pre-dephasing gradient pulse and a plurality of phase encoding gradient pulses applied after the pre-dephasing gradient pulse, and the pre-dephasing gradient pulses in the plurality of diffusion-weighted imaging sequences, when sorted according to area values, successively having a first standard area difference determined on the basis of the number of the plurality of diffusion directions. The processor is further used to perform data fusion processing on the plurality of k-space data sets in the single signal acquisition to obtain a magnetic resonance image.

Another aspect of the present invention further provides a magnetic resonance imaging system, comprising: a gradient coil used to generate a gradient pulse; a radio-frequency coil used to generate a radio-frequency pulse; and a processor used to control timings of the gradient coil and the radio-frequency coil to generate the gradient pulse and the radio-frequency pulse, so as to perform the following method. The method includes performing one or more single signal acquisitions in each of a plurality of diffusion directions, wherein a diffusion-weighted imaging sequence is performed in each single signal acquisition, in the diffusion-weighted imaging sequence, multiple excitations are employed to acquire a plurality of partial k-space data sets, and each excitation comprises a pre-dephasing gradient pulse and a plurality of phase encoding gradient pulses applied after the pre-dephasing gradient pulse, and wherein the plurality of pre-dephasing gradient pulses in the multiple excitations of the one or more single signal acquisitions in the plurality of diffusion directions successively have a second standard area difference when sorted according to area values, and the second standard area difference is determined on the basis of the number of the diffusion directions, the number of the single signal acquisitions, and the number of excitations of the diffusion-weighted imaging sequence used in each single signal acquisition. The processor is further used to perform data fusion processing on the plurality of partial k-space data sets obtained from the one or more single signal acquisitions in the plurality of directions to obtain a magnetic resonance image.

It should be understood that the brief description above is provided to introduce, in a simplified form, concepts that will be further described in the detailed description. The brief description above is not meant to identify key or essential features of the claimed subject matter. The scope is defined uniquely by the claims that follow the detailed description. Furthermore, the claimed subject matter is not limited to implementations that solve any deficiencies raised above or in any section of the present disclosure.

BRIEF DESCRIPTION OF THE DRAWINGS

The present invention will be better understood by reading the following description of non-limiting embodiments with reference to the accompanying drawings, wherein

FIG. 3 is a flowchart of a magnetic resonance imaging method according to an embodiment of the present invention;

FIG. 6 is a flowchart of a magnetic resonance imaging method according to another embodiment of the present invention;

FIG. 8 is a flowchart of a magnetic resonance imaging method according to another embodiment of the present invention;

FIG. 10 shows two partial k-space data sets generated from two excitations in the same single signal acquisition;

Figure 1:
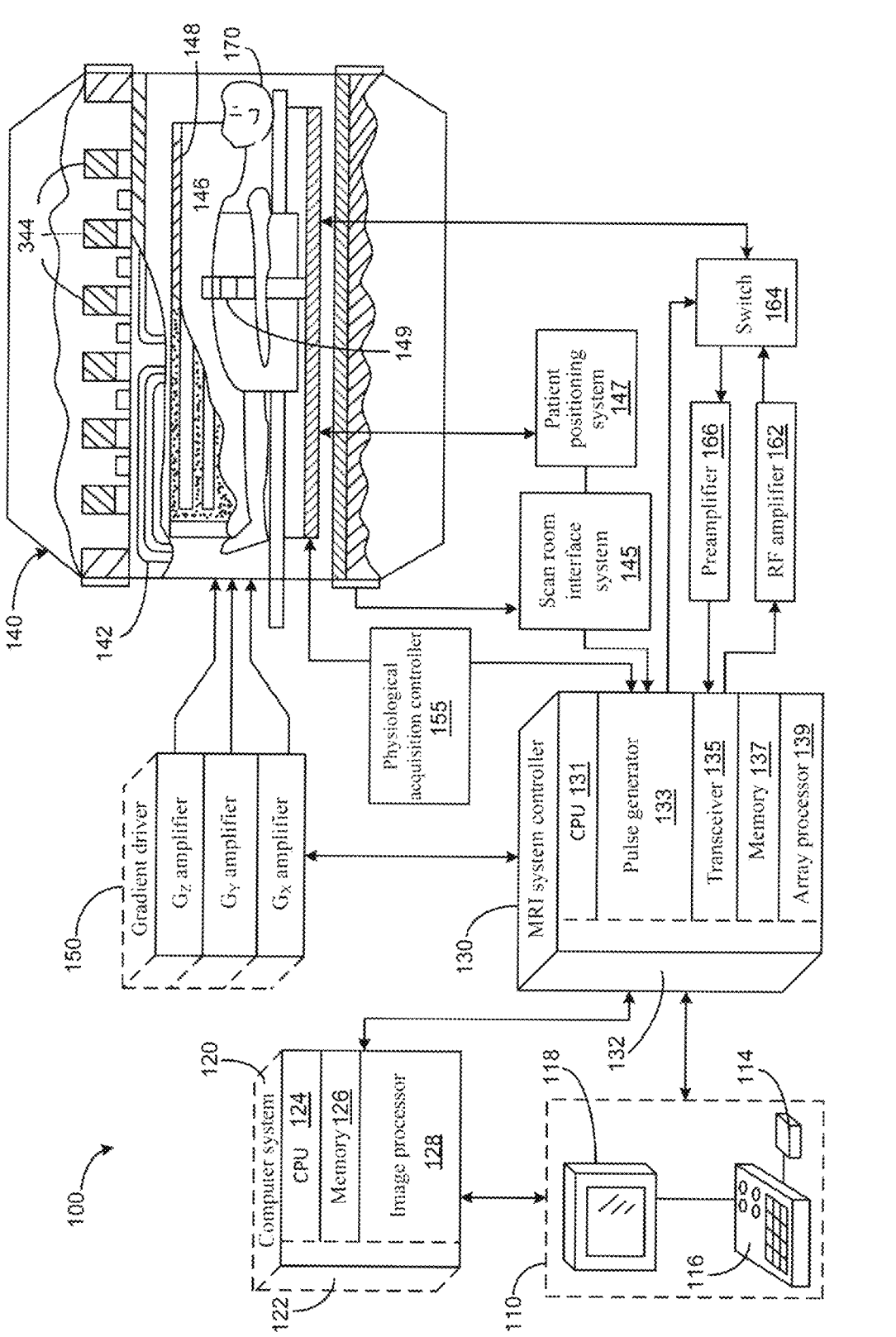
FIG. 1 is a schematic diagram of a magnetic resonance imaging (MRI) system according to an exemplary embodiment.

The accompanying drawings illustrate components, systems, and methods described in the MRI method and system. Together with the following description, the accompanying drawings illustrate and explain structural principles, methods, and principles described herein. In the accompanying drawings, the thickness and dimensions of the components may be enlarged or otherwise modified for clarity. Well-known structures, materials, or operations are not shown or described in detail to avoid obscuring the components, systems, and methods described.

DETAILED DESCRIPTION

Specific embodiments of the present invention will be described below. It should be noted that in the specific description of said embodiments, for the sake of brevity and conciseness, the present description cannot describe all of the features of the actual embodiments in detail. It should be understood that in the actual implementation process of any embodiment, just as in the process of any one engineering project or design project, a variety of specific decisions are often made to achieve specific goals of the developer and to meet system-related or business-related constraints, which may also vary from one embodiment to another. Furthermore, it should also be understood that although efforts made in such development processes may be complex and tedious, for a person of ordinary skill in the art related to the content disclosed in the present invention, some design, manufacture, or production changes made on the basis of the technical content disclosed in the present disclosure are only common technical means, and should not be construed as the content of the present disclosure being insufficient.

Unless otherwise defined, the technical or scientific terms used in the claims and the description should be as they are usually understood by those possessing ordinary skill in the technical field to which they belong. Terms such as "first", "second", and similar terms used in the present description and claims do not denote any order, quantity, or importance, but are only intended to distinguish different constituents. The terms "one" or "a/an" and similar terms do not express a limitation of quantity, but rather that at least one is present. The terms "include" or "comprise" and similar words indicate that an element or object preceding the terms "include" or "comprise" encompasses elements or objects and equivalent elements thereof listed after the terms "include" or "comprise", and do not exclude other elements or objects. The terms "connect" or "link" and similar words are not limited to physical or mechanical connections, and are not limited to direct or indirect connections. Furthermore, it should be understood that references to "an embodiment" or "embodiments" of the present disclosure are not intended to be construed as excluding the existence of additional implementations that also incorporate the referenced features.

With reference to the drawings, the present disclosure describes a magnetic resonance imaging system and a magnetic resonance imaging method capable of suppressing Nyquist artifacts and acceleration artifacts. In a single signal acquisition, a plurality of diffusion-weighted imaging sequences are applied in a plurality of diffusion directions, respectively, to acquire a plurality of k-space data sets, and each diffusion-weighted imaging sequence includes a pre-dephasing gradient pulse and a plurality of phase encoding gradient pulses applied after the pre-dephasing gradient pulse. The pre-dephasing gradient pulses in the plurality of diffusion-weighted imaging sequences, when sorted according to area values, successively have a first standard area difference determined on the basis of the number of the plurality of diffusion directions.

In this way, artifact data in the plurality of diffusion directions are attenuated, so that both Nyquist artifacts and acceleration artifacts are suppressed in the final obtained MR image.

Referring to FIG. 1, a schematic diagram of an exemplary magnetic resonance imaging (MRI) system 100 according to some embodiments is shown. The operation of the MRI system 100 is controlled by an operator workstation 110 that includes an input device 114, a control panel 116 and a display 118. The input apparatus 114 may be a joystick, a keyboard, a mouse, a trackball, a touch-activated screen, voice control, or any similar or equivalent input apparatus. The control panel 116 may include a keyboard, a touch-activated screen, voice control, a button, a slider, or any similar or equivalent control apparatus. The operator workstation 110 is coupled to and in communication with a computer system 120 that enables an operator to control generation and display of images on the display 118. The computer system 120 includes various components that communicate with one another via an electrical and/or data connection module 122. The connection module 122 may be a direct wired connection, a fiber optic connection, a wireless communication link, etc. The computer system 120 may include a central processing unit (CPU) 124, a memory 126, and an image processor 128. In some embodiments, the image processor 128 may be replaced by image processing functions implemented in the CPU 124. The computer system 120 may be connected to an archive media apparatus, a persistent or backup memory, or a network. The computer system 120 may be coupled to and communicates with a separate MRI system controller 130.

The MRI system controller 130 includes a set of components that communicate with one another via an electrical and/or data connection module 132. The connection module 132 may be a direct wired connection, a fiber optic connection, a wireless communication link, etc. The MRI system controller 130 may include a CPU 131, a sequence pulse generator 133 which is in communication with the operator workstation 110, a transceiver (or an RF transceiver) 135, a memory 137, and an array processor 139. In some embodiments, the sequence pulse generator 133 may be integrated into the resonance assembly 140 of the MRI system 100. The MRI system controller 130 may receive a command from the operator workstation 110 to indicate an MRI scan sequence that is to be executed during the MRI scan. The MRI system controller 130 is further coupled to and in communication with a gradient driver system 150, which is coupled to a gradient coil assembly 142 to generate a magnetic field gradient during the MRI scan.

The sequence pulse generator 133 may further receive data from a physiological acquisition controller 155, which receives signals from a number of different sensors, such as electrocardiogram (ECG) signals from electrodes attached to a patient, which are connected to the subject or patient 170 undergoing an MRI scan. The sequence pulse generator 133 is coupled to and in communication with a scan room interface system 145 that receives signals from various sensors associated with the state of the resonance assembly 140. The scan room interface system 145 is further coupled to and in communication with a patient positioning system 147 that sends and receives signals to control movement of a patient table to a desired position to perform the MRI scan.

The MRI system controller 130 provides gradient waveforms to a gradient driver system 150, and the gradient driver system includes $G_x$, $G_y$, and $G_z$ amplifiers, etc. Each of the $G_x$, $G_y$, and $G_z$ gradient amplifiers excites a corresponding gradient coil in the gradient coil assembly 142, so as to generate a magnetic field gradient used to spatially encode an MR signal during the MR scan. The gradient coil assembly 142 is disposed within the resonance assembly 140, and the resonance assembly further includes a superconducting magnet having a superconducting coil 144 that, in operation, provides a static uniform longitudinal magnetic field $B_0$ throughout a cylindrical imaging volume 146. The resonance assembly 140 further includes an RF body coil 148, which, in operation, provides a transverse magnetic field $B_1$, and the transverse magnetic field $B_1$ is substantially perpendicular to $B_0$ throughout the cylindrical imaging volume 146. The resonance assembly 140 may further include an RF surface coil 149 for imaging different anatomical structures of the patient undergoing the MRI scan. The RF body coil 148 and the RF surface coil 149 may be configured to operate in a transmit and receive mode, a transmit mode, or a receive mode.

The subject or patient 170 of the MRI scan may be positioned within the cylindrical imaging volume 146 of the resonance assembly 140. A transceiver 135 in the MRI system controller 130 generates RF excitation pulses that are amplified by an RF amplifier 162 and provided to the RF body coil 148 through a transmit/receive switch (T/R switch) 164.

As described above, the RF body coil 148 and the RF surface coil 149 may be used to transmit RF excitation pulses and/or receive resulting MR signals from the patient undergoing the MRI scan. The MR signals emitted by excited nuclei in the patient of the MRI scan may be sensed and received by the RF body coil 148 or the RF surface coil 149 and sent back to a preamplifier 166 through the T/R switch 164. The T/R switch 164 may be controlled by a signal from the sequence pulse generator 133 to electrically connect the RF amplifier 162 to the RF body coil 148 in the transmit mode and to connect the pre-amplifier 166 to the RF body coil 148 in the receive mode. The T/R switch 164 may further enable the RF surface coil 149 to be used in the transmit mode or the receive mode.

In some embodiments, the MR signals sensed and received by the RF body coil 148 or the RF surface coil 149 and amplified by the preamplifier 166 are stored in the memory 137 for post-processing as a raw k-space data array. A reconstructed magnetic resonance image may be obtained by transforming/processing the stored raw k-space data.

In some embodiments, the MR signals sensed and received by the RF body coil 148 or the RF surface coil 149 and amplified by the preamplifier 166 are demodulated, filtered, and digitized in a receiving portion of the transceiver 135, and transmitted to the memory 137 in the MRI system controller 130. For each image to be reconstructed, the data is rearranged into separate k-space data arrays, and each of said separate k-space data arrays is input to the array processor 139, the array processor being operated to transform the data into an array of image data by Fourier transform.

The array processor 139 uses transform methods, most commonly Fourier transform, to create images from the received MR signals. These images are transmitted to the computer system 120 and stored in the memory 126. In response to commands received from the operator workstation 110, the image data may be stored in a long-term memory, or may be further processed by the image processor 128 and transmitted to the operator workstation 110 for presentation on the display 118.

In various embodiments, components of the computer system 120 and the MRI system controller 130 may be implemented on the same computer system or on a plurality of computer systems. It should be understood that the MRI system 100 shown in FIG. 1 is intended for illustration. Suitable MRI systems may include more, fewer, and/or different components.

The MRI system controller 130 and the image processor 128 may separately or collectively include a computer processor and a storage medium. The storage medium records a predetermined data processing program to be executed by the computer processor. For example, the storage medium may store a program used to implement scanning processing (such as a scan flow and an imaging sequence), image reconstruction, image processing, etc. For example, the storage medium may store a program used to implement the magnetic resonance imaging method according to the embodiments of the present invention. The described storage medium may include, for example, a ROM, a floppy disk, a hard disk, an optical disk, a magneto-optical disk, a CD-ROM, or a non-volatile memory card.

The aforementioned "imaging sequence" refers to a combination of pulses having specific amplitudes, widths, directions, and time sequences and applied when a magnetic resonance imaging scan is executed. The pulses may typically include, for example, a radio-frequency pulse and a gradient pulse. The radio-frequency pulses may include, for example, radio-frequency excitation pulses, radio-frequency refocusing pulses, inverse recovery pulses, etc. The gradient pulses may include, for example, the aforementioned gradient pulse used for layer selection, gradient pulse used for phase encoding, gradient pulse used for frequency encoding, gradient pulse used for phase shifting (phase shift), gradient pulse used for dispersion of phases (dephasing), etc.

Typically, a plurality of scanning sequences can be pre-set in the magnetic resonance system, so that the sequence suitable for clinical detection requirements can be selected. The clinical detection requirements may include, for example, an imaging site, an imaging function, an imaging effect, and the like.

For example, a magnetic resonance imaging sequence capable of simultaneously suppressing Nyquist artifacts and acceleration artifacts in the embodiments of the present invention may be preset, and the imaging sequence may include a preparation sequence and an echo plane imaging (EPI) sequence, where the preparation sequence may be combined with the EPI sequence to create a new clinically applicable sequence, such as a DWI (diffusion-weighted imaging)-EPI (echo plane imaging) sequence. The EPI sequence may include a spin echo (SE) EPI, a gradient echo (GRE) EPI, or an EPI sequence with any other echo type.

Conventional EPI is an accelerated imaging technique in which an entire image can be formed from a plurality of echo signals generated by a single radio-frequency (RF) excitation. In a k-space, one echo is generated along each phase line in the k-space.

In addition, in some applications, a multi-excitation (multi-shot) EPI is used instead of the conventional single-excitation (single-shot) EPI, and thus higher image resolution is obtained. Compared with the single-excitation EPI, the multi-excitation EPI includes a plurality of radio-frequency excitation pulses. After each radio-frequency excitation pulse, a plurality of echoes are obtained, which form a part of the k-space. On the basis of all of the echoes obtained by applying the plurality of radio-frequency excitation pulses, a complete k-space is formed.

In addition, in clinical applications, it may be necessary to repeatedly perform a set imaging sequence to improve imaging performance, such as improving a signal-to-noise ratio. The number of times the imaging sequence is repeatedly performed may be referred to as the number of signal acquisitions or the average number of acquisitions, corresponding to NEX, NSA, Average, NAQ, and other technical terms used by different manufacturers. In this embodiment, performing one imaging sequence is referred to as a single signal acquisition, namely, one NEX (or NSA or Average or NAQ), and performing a plurality of NEXs means performing a plurality of single signal acquisitions described above.

In k-space acquisition, a readout gradient field direction is alternately changed so that two adjacent echoes, such as a forward echo and a backward echo, are acquired in opposite directions. Eddy currents due to rapid gradient changes, gradient coil heating, gradient system delays, etc. all have the potential to prevent forward and backward echoes from producing perfect mirror images of each other and thus introduce artifacts into an image during reconstruction. For example, a delay from the start of the first echo will propagate to all subsequent echoes, resulting in a timing difference between the peaks of odd and even echoes. When a Fourier transform is performed, this phase error will cause signal intensity to shift in a phase-encoding direction of half the image, which is known as Nyquist ghosting. In addition, since an acceleration technique of parallel imaging is usually implemented at the same time in EPI, parallel acceleration artifacts caused by wrapping appear in edge regions of the image.

As described above, the embodiments of the present invention can be applied to diffusion-weighted imaging, and diffusion-weighted technology may be applied to the diagnosis of tissue functions in various organs (e.g., brain, cartilage, and liver) and various applications (e.g., pathology and oncology). Diffusion (or diffusion) refers to the random movement of molecules in tissues. In a biological tissue, the diffusion of water molecules forms a pattern based on the structure and properties of the tissue. In some disease states, the pattern of diffusion may be disturbed, and the amount of diffusion may vary in areas affected by diseases. Therefore, tissue abnormalities can be detected by studying changes in diffusion. The contrast of diffusion-weighted images reflects differences in diffusion rates between tissues.

Figure 2:
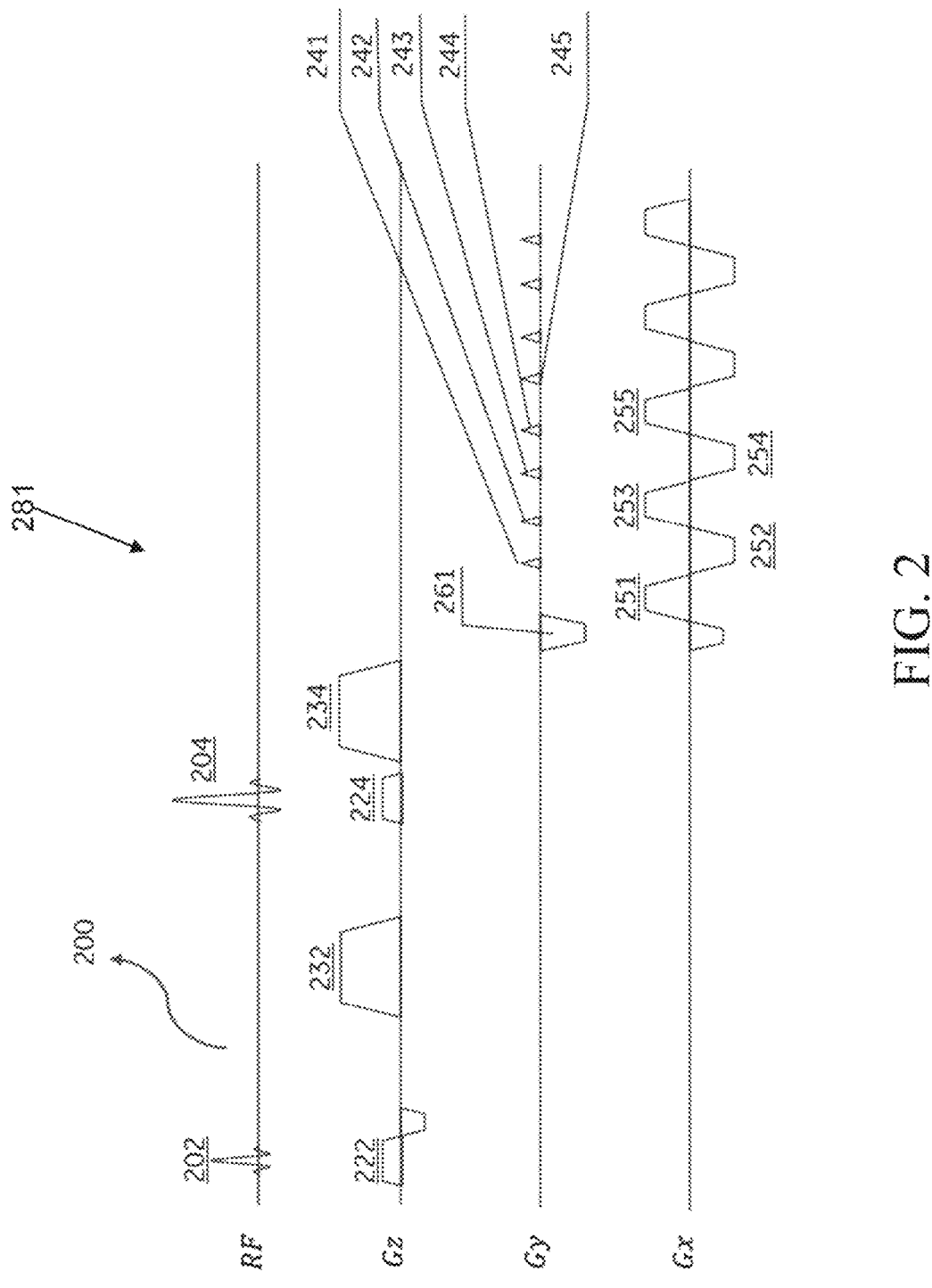
FIG. 2 is an example of a DWI-EPI sequence used in an embodiment of the present invention.

FIG. 2 shows an example of a DWI-EPI sequence 200 used in an embodiment of the present invention, which includes a sequence 281. Although only one sequence 281 is shown in the figure, the DWI-EPI sequence 200 may include a plurality of repeatedly applied sequences 281. Each of the plurality of sequences 281 includes a radio-frequency (RF) excitation pulse 202 and a radio-frequency refocusing pulse 204 applied sequentially, and slice selection gradient (GSS) pulses 222 and 224 which are applied along with the radio-frequency excitation pulse 202 and the radio-frequency refocusing pulse 204, respectively.

Each of the plurality of sequences 281 further includes a diffusion gradient (GDG) pulse for proton diffusion. The diffusion gradient pulse includes a phase shifting gradient pulse 232 and a re-phasing gradient pulse 234. The phase shifting gradient pulse 232 and the re-phasing gradient pulse 234 are applied on two sides (before and after) of the radio-frequency refocusing pulse 204, respectively. In some applications, applying the diffusion gradient pulse 230 can cause moving hydrogen protons to dephase, whereas stationary hydrogen protons do not diffuse, the phase of which is preserved to the greatest extent, showing as a high signal.

The diffusion gradient pulse may be applied in different gradient directions to cause diffusion of water molecules (or hydrogen protons) in corresponding directions. For example, the phase shifting gradient pulse 232 and the re-phasing gradient pulse 234 may first be applied in a first gradient direction (e.g., Z-axis gradient) and a complete imaging sequence is performed to generate first image data. Subsequently, a similar imaging sequence may be repeatedly performed, wherein the phase shifting gradient pulse 232 and the re-phasing gradient pulse 234 are applied in other different gradient directions (e.g., X-axis gradient, Y-axis gradient, or other tilted gradients) to generate second image data. The imaging sequence may be further performed by changing the gradient direction in which the diffusion gradient pulse is applied, so as to generate image data. The image data described above is processed using an image processing algorithm to generate a final diffusion-weighted image. In the embodiments of the present invention, the gradient direction in which the diffusion gradient pulse is applied is referred to as a diffusion direction.

The phase shifting gradient pulse 232 is used to introduce a phase shift into protons according to the positions of the protons, and the re-phasing gradient pulse 234 reverses the above change made by the phase shifting gradient pulse 232. For fixed spins, the phase thereof is not affected by the diffusion gradient pulse, since any phase accumulation from the phase shifting gradient pulse 232 will be inverted by the re-phasing gradient pulse 234. However, the diffusion spins move to different positions between the phase shifting gradient pulse 232 and the re-phasing gradient pulse 234, losing phases and losing signals. That is, if the protons move, the re-phasing gradient pulse 234 will not completely undo the phase shift caused by the phase shifting gradient pulse 232. Therefore, there will be signal attenuation. This signal attenuation from the net motion of protons is given by a Stejskal-Tanner formula:

$$S(b) = S_0 e^{-bD}. \tag{1}$$

where S (b) is a signal received when a specific diffusion gradient pulse is applied, $S_0$ is signal strength without any diffusion gradient, e is a constant, D is a diffusion or apparent diffusion coefficient (ADC), and b is a diffusion weighting degree used for the specific diffusion gradient pulse. The value of b can be controlled by manipulating the intensity, duration, and spacing of the diffusion gradient pulse pair 232 and 234. Specifically, the value of b is given by:

$$b = \gamma^2 G^2 \delta^2 \left( \Delta - \frac{\delta}{3} \right). \tag{2}$$

where $\gamma$ is the gyromagnetic ratio of hydrogen protons, G is the amplitude of the diffusion gradient pulse, $\delta$ is the duration of the diffusion gradient pulse, and $\Delta$ is the time between application of two diffusion gradient pulses. In clinical applications, usually sequences are set to provide a plurality of images with diffusion directions and ranges of b-values, and sometimes ADC mappings can be calculated. For example, several DW (diffusion weighted) images with different b-values can be obtained by changing the configuration of diffusion gradient pulse pairs. At higher b-values, effects of diffusion are more pronounced in tissues with high diffusion in the image, as shown by low signal regions in the image, while tissues with restricted diffusion are shown by high signal regions.

Each of the plurality of sequences 281 further includes a pre-dephasing gradient pulse 261, which is applied after the re-phasing gradient pulse 234.

The sequence 200 further includes a plurality of phase encoding gradient pulses 241, 242, 243, 244, 245 . . . , and a plurality of frequency encoding gradient pulses 251, 252, 253, 254, 255 . . . , which are applied after the pre-dephasing gradient pulse 261. The number of phase encoding gradient pulses and frequency encoding gradient pulses may vary on the basis of actual situations.

The directions of the plurality of frequency encoding gradient pulses 241, 242, 243, 244, 245 . . . , are alternately inverted, and the plurality of phase encoding gradient pulses are applied when the directions of the plurality of frequency encoding gradient pulses are inverted, respectively. For example, in FIG. 2, there are a plurality of small "spikes" at each position where the frequency encoding gradient pulse is inverted, i.e., the plurality of phase encoding gradient pulses 251, 252, 253, 254, and 255 described above. For example, a spike 241 is applied at the start of a negative frequency encoding (or readout) gradient pulse 251; a spike 242 is placed at the inversion from the negative readout gradient 251 to a positive readout gradient 252, and a spike 243 is placed at the inversion from the positive readout gradient 252 to a negative readout gradient 253, and so on.

The spikes are of a constant size, and each adds further phase encoding to previous spikes. The plurality of phase encoding gradient pulses 251, 252, 253, 254, and 255 rapidly oscillate to generate a plurality of gradient echoes (not shown in the figure).

Although the sequence 200 shows one radio-frequency excitation pulse in one sequence 281, when applying a multi-excitation EPI sequence, the sequence applied in each diffusion direction may have two or more "shots". For example, the sequence 281 shown in FIG. 2 is repeated after an echo.

In addition, the sequence with one or more "shots" applied in each diffusion direction may be further repeatedly performed multiple times, that is, there are a plurality of single signal acquisitions (NEX).

Figure 4:
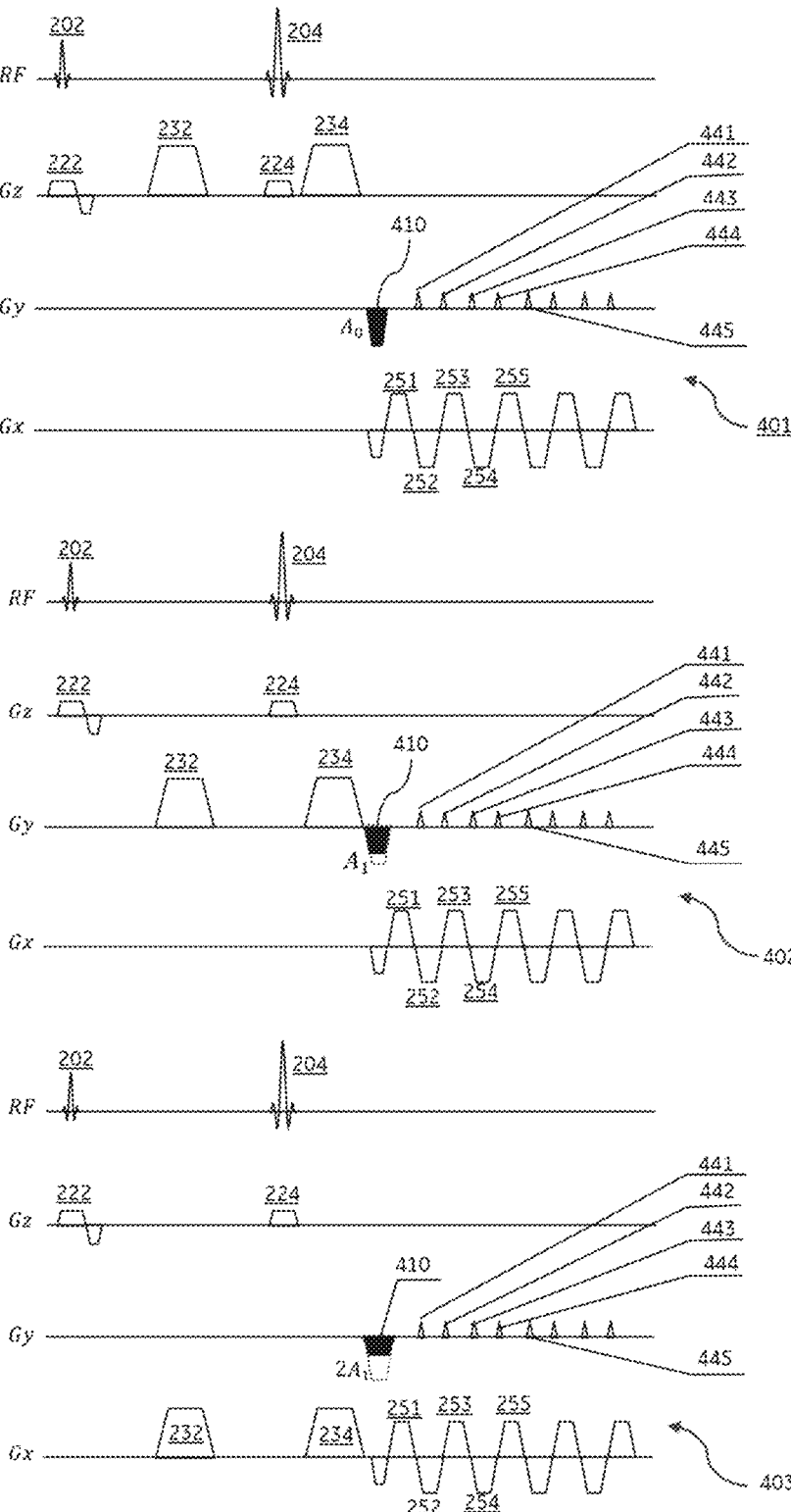
FIG. 4 is a schematic diagram of an exemplary imaging sequence used in the method shown in FIG. 3.

FIG. 3 shows a flowchart of a magnetic resonance imaging method 300 according to an exemplary embodiment of the present invention, and FIG. 4 shows a schematic diagram of an exemplary imaging sequence applied in the method 300, wherein diffusion-weighted imaging sequences 401, 402, and 403 in a single signal acquisition in three different diffusion directions are shown. The diffusion-weighted imaging sequence in each diffusion direction in FIG. 4 differs from the sequence shown in FIG. 2 in that the area of the pre-dephasing gradient pulse 410 in the corresponding sequence varies on the basis of different diffusion directions.

In step 310, in a single signal acquisition, a plurality of diffusion-weighted imaging sequences are applied in a plurality of diffusion directions, respectively, to acquire a plurality of k-space data sets. As shown in FIG. 4, for ease of understanding, the plurality of diffusion directions may be along the X-axis gradient, Y-axis gradient, and Z-axis gradient, respectively, and thus, image data in the plurality of diffusion directions are generated by means of the plurality of diffusion-weighted imaging sequences. In other examples, the diffusion direction may be any other direction in three-dimensional space.

Each diffusion-weighted imaging sequence includes a pre-dephasing gradient pulse 410 and a plurality of phase encoding gradient pulses 441, 442, 443, 444, 445 . . . , applied after the pre-dephasing gradient pulse. The plurality of phase encoding gradient pulses may be similar to the plurality of "spikes" shown in FIG. 2.

By setting the area of the pre-dephasing gradient pulse 410, the phases of a plurality of corresponding gradient echoes may be controlled. In the embodiments of the present invention, the pre-dephasing gradient pulses 410 of the plurality of diffusion-weighted imaging sequences corresponding to the plurality of diffusion directions have different areas.

Specifically, the pre-dephasing gradient pulses 410 in the plurality of diffusion-weighted imaging sequences, when sorted according to area values, successively have a first standard area difference $A_1$ determined on the basis of the number of the plurality of diffusion directions.

Moreover, the present invention does not limit the execution order of the plurality of diffusion-weighted imaging sequences, and the execution order may be the same as or different from the above-mentioned order according to area values.

In step 320, data fusion processing is performed on the plurality of k-space data sets to obtain a magnetic resonance image.

In this way, the area value of the pre-dephasing gradient pulse 410 is changed in such a way that when a plurality of k-space data sets in the plurality of diffusion directions are acquired, both Nyquist artifacts and acceleration artifacts in fused image data obtained on the basis of magnetic resonance images of the plurality pieces of k-space data can be better suppressed. Moreover, since the area of the pre-dephasing gradient pulse 410 is changed with the diffusion direction, there is no need to additionally increase the number of single signal acquisitions or the number of "shots" in each single signal acquisition for the purpose of removing Nyquist artifacts and acceleration artifacts. Therefore, no additional scan time is required for this purpose. Furthermore, there is no need to change existing image reconstruction algorithms. For example, for data fusion of magnetic resonance data in a plurality of diffusion directions, a fusion algorithm that has been set in an existing system may be employed without additional software design costs.

For example, in the diffusion-weighted imaging sequence in the Z-axis diffusion direction, the pre-dephasing gradient pulse 410 has an initial area $A_0$. In the sequences in the Y-axis and X-axis diffusion directions in FIG. 4, the first standard area difference $A_1$ and the area difference $2A_1$ are indicated by dotted lines at the pre-dephasing gradient pulses 410, respectively. Then, in the X-axis and Y-axis diffusion directions, the areas of the pre-dephasing gradient pulses may be $A_0-A_1$ and $A_0-2A1$, respectively, or may be $A_0+A_1$ and $A_0+2A_1$, respectively.

Since the area of each pre-dephasing gradient pulse 410 affects the phases of the plurality of gradient echoes in the corresponding sequence, correspondingly, phase encoding lines of different k-spaces are also shifted as a whole. When data fusion processing is performed on a plurality of k-space data sets with phase shifts, Nyquist artifacts and acceleration artifacts in the obtained magnetic resonance image are suppressed.

Further, by setting a suitable standard area difference, the above-mentioned artifact suppression effect can be better achieved. In an embodiment, the first standard area difference $A_1$ is 2/N of the area $A_3$ of any one of the phase encoding gradient pulses 421, 422, 423, 424, 425 . . . , where N is the number of the plurality of diffusion directions.

Figure 5:
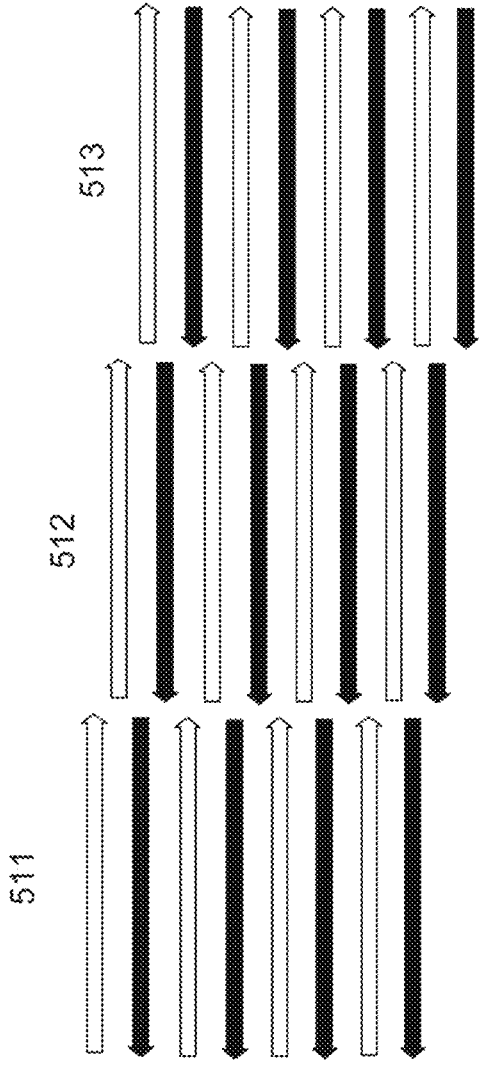
FIG. 5 is a schematic diagram of k-space data acquisition trajectory lines obtained according to the sequence of FIG. 4.

Referring to FIG. 5, a schematic diagram of k-space data acquisition trajectory lines obtained according to the sequence of FIG. 4 is shown. When a diffusion-weighted imaging sequence 401 with a first diffusion direction (wherein the pre-dephasing gradient pulse has an initial area $A_0$) is applied, a k-space data set 511 is acquired. When a diffusion-weighted imaging sequence 402 with a second diffusion direction (wherein the area of the pre-dephasing gradient pulse is $$A_0 - \frac{2A_3}{3}$$

) is applied, a k-space data set 512 is acquired. When a diffusion-weighted imaging sequence 403 with a third diffusion direction (wherein the area of the pre-dephasing gradient pulse is $$A_0 - \frac{4A_3}{3}$$

) is applied, a k-space data set 513 is acquired. For the k-space data set 512, its trajectory lines as a whole move downward by ⅔ of the spacing between adjacent trajectory lines as compared with the k-space data set 511. For the k-space data set 513, its trajectory lines as a whole move downward by 4/3 of the spacing between adjacent trajectory lines as compared with the k-space data set 511.

By performing data fusion on the k-space data sets 511, 512, and 513, a magnetic resonance image having a better artifact suppression effect can be obtained.

In an example, the above-mentioned data fusion may be performed on the basis of the following algorithm:

$$I_1 = I_{d1}^{\frac{1}{3}} * I_{d2}^{\frac{1}{3}} * I_{d3}^{\frac{1}{3}} \tag{1}$$

where $I_1$ is a magnetic resonance image data after data fusion, and $I_{d1}$, $I_{d2}$, and $I_{d3}$ are image data obtained on the basis of the k-space data sets 511, 512, and 513, respectively.

It is understood by those skilled in the art that other algorithms may also be employed for data fusion, and the present invention is not limited thereto.

In the embodiments of the present invention, the diffusion-weighted imaging sequence in each diffusion direction in FIG. 4 may be performed one or more times, that is, there is one or more single signal acquisitions. Taking the sequence 401 as an example, when there are M single signal acquisitions, the sequence 401 is repeatedly performed M times. For the diffusion-weighted imaging sequences in the same direction, the pre-dephasing gradient pulses in a plurality of single signal acquisitions may have the same area.

However, in order to further improve the artifact suppression effect, the area of the pre-dephasing gradient pulse may also be changed with the execution sequence of the plurality of single signal acquisitions, that is, the first standard area difference may further be determined jointly on the basis of the number of diffusion directions and the number of single signal acquisitions.

FIG. 6 shows a flowchart of a magnetic resonance imaging method 600 according to another embodiment of the present invention, which includes step 310, and further includes steps 610 and 620. In step 610, a plurality of single signal acquisitions are performed. The single signal acquisition may include performing a diffusion-weighted imaging sequence in any direction shown in FIG. 4. When performing a plurality of single signal acquisitions, step 320 may include step 620, wherein data fusion processing is performed on k-space data obtained in the plurality of single signal acquisitions to obtain a magnetic resonance image.

As described above, the first standard area difference may be determined on the basis of the number of diffusion directions and the number of single signal acquisitions. Specifically, when a diffusion-weighted imaging sequence in any diffusion direction is performed in the plurality of single signal acquisitions, the first standard area difference set for the pre-dephasing gradient pulse 410 may be a 2/(N*M) of the area of any phase encoding gradient pulse, where N is the number of the plurality of diffusion directions, and M is the number of the single-signal acquisitions.

The sequences 401, 402, and 403 in the three diffusion directions in FIG. 4 are described as an example. The sequences 401, 402, and 403 are performed in each of two single signal acquisitions, wherein when the sequence 401 is performed in the first single signal acquisition, the area of the pre-dephasing gradient pulse is $A_{10}$, and when the sequence 401 is performed in the second single signal acquisition, the area of the pre-dephasing gradient pulse is $A_{10}-A_{11}$, where $A_{11}=2A_{3/6}$ When the sequence 402 is performed in the first single signal acquisition, the area of the pre-dephasing gradient pulse is $A_{10}-4A_{3/4}$, and when the sequence 401 is performed in the second single signal acquisition, the area of the pre-dephasing gradient pulse is $A_{10}$–$A_3$. When the sequence 403 is performed in the first single signal acquisition, the area of the pre-dephasing gradient pulse is $A_{10}$–$8A_{3/6}$, and when the sequence 403 is performed in the second single signal acquisition, the area of the pre-dephasing gradient pulse is $A_{10}$–$10A_{3/6}$. In this way, six pieces of k-space data generated have phase shifts from each other.

Each diffusion-weighted imaging sequence performed in each diffusion direction described above may include a single-excitation or multi-excitation EPI sequence. That is, each sequence may have one or more "shots". In other words, each sequence may have one or more radio-frequency excitation pulses. Taking the sequence 401 as an example, there may be J "shots", that is, after the echo signal of the sequence diagram shown in FIG. 4, the same sequence as the sequence 401 shown in FIG. 4 is applied J times again. For diffusion-weighted imaging sequences in the same direction and in the same single signal acquisition, the pre-dephasing gradient pulses of a plurality of "shots" may have the same area.

However, in order to further improve the artifact suppression effect, the area of the pre-dephasing gradient pulse may also be changed with the number of radio-frequency excitations (or the number of "shots") in the same single signal acquisition, that is, the first standard area difference $A_1$ may be further determined jointly on the basis of the number of diffusion directions and the number of radio-frequency excitations.

Specifically, the first standard area difference $A_1$ may be $2/(N*J)$ of the area $A_3$ of any phase encoding gradient, where N is the number of the plurality of diffusion directions, and J is the number of radio-frequency excitations in each EPI sequence (or diffusion-weighted imaging sequence).

The sequences 401, 402, and 403 in the three diffusion directions in FIG. 4 are described as an example. Each of the sequences 401, 402, and 403 may include, for example, 3 "shots", each "shot" acquiring ⅓ of the k-space data, wherein when a first "shot" of the sequence 401 is performed, the area of the pre-dephasing gradient pulse is $A_{20}$; when a second "shot" of the sequence 401 is performed, the area of the pre-dephasing gradient pulse is $A_{20}$–$A_{21}$, where $A_{21}$=$4A_{3/9}$; and when a third "shot" of the sequence 401 is performed, the area of the pre-dephasing gradient pulse is $A_{20}$–$4A_{3/9}$. By performing the three "shots" of the sequence 401, three parts of one piece of k-space data with phase shifts are obtained. Correspondingly, when the sequence 402 is performed, in the three "shots", the areas of the pre-dephasing gradient pulses are $A_{20}$–$6A_{3/9}$, $A_{20}$–$8A_{3/9}$ and $A_{20}$–$10A_{3/9}$, respectively. When the sequence 403 is performed, in the three "shots", the areas of the pre-dephasing gradient pulses are $A_{20}$–$12A_{3/9}$, $A_{20}$–$14A_{3/9}$ and $A_{20}$–$16A_{3/9}$, respectively.

In this way, three pieces of k-space data in the three diffusion directions are generated. Each of the three pieces of k-space data has three parts to form 9 pieces of partial k-space data, and the 9 pieces of partial k-space data have phase shifts from each other.

Figure 7:
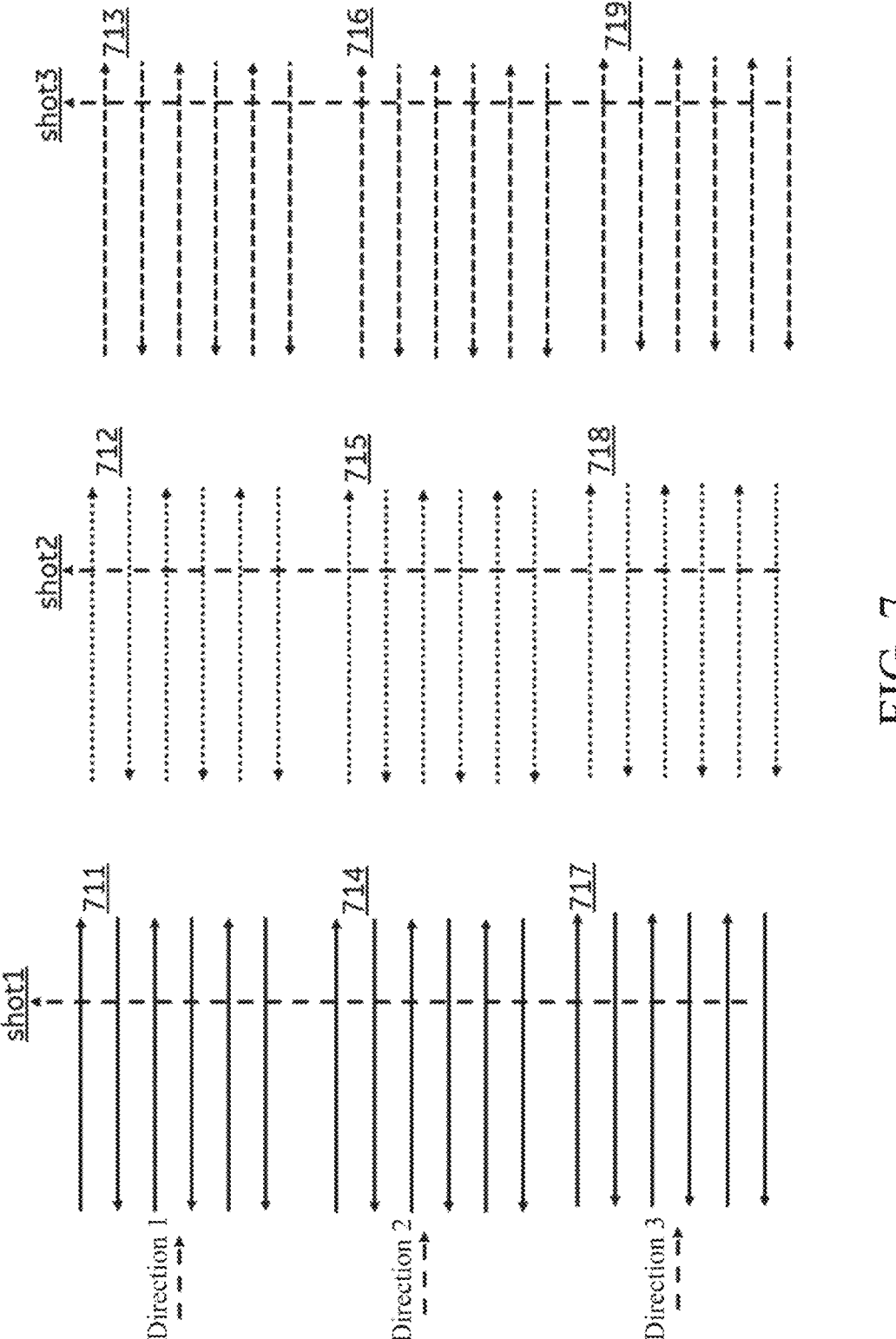
FIG. 7 is a schematic diagram of k-space data acquisition trajectory lines obtained according to the method shown in FIG. 6.

With reference to FIG. 7, an exemplary schematic diagram of k-space data acquisition trajectory lines is shown, wherein the k-space data acquisition trajectory lines are generated by performing diffusion-weighted imaging sequences having a plurality of radio-frequency excitations (taking shot1, shot2, and shot3 as an example) in a plurality of diffusion directions, respectively. Data sets 711, 712, and 713 are partial k-space data in a first diffusion direction, and when the data sets 711, 712, and 713 are combined, a complete k-space data set in the first diffusion direction is formed. Data sets 714, 715, and 716 are partial k-space data in a second diffusion direction, and when these data sets are combined, a complete k-space data set in the second diffusion direction is formed. Similarly, when data sets 717, 718, and 719 are combined, a complete k-space data set in the third diffusion direction is formed. Moreover, the data sets 711-719 have fixed phase shifts from each other, and the phase shift is determined by the area change value (i.e., the first standard area difference) of the pre-dephasing gradient pulse in the corresponding "shots".

First fused data may be obtained by performing first data fusion (for example, based on algorithm (1)) on partial (or complete) k-space data (for example, 711, 714, and 717) with the same "shot" serial number in different diffusion directions (for example, directions 1-3), and second fused data may also be obtained by performing second fusion on the k-space data (for example, 711, 712, and 713) generated by a plurality of "shots" in the same diffusion direction. The image data obtained by means of the first data fusion may be used as input for the second data fusion, and conversely, the image data obtained by means of the second data fusion may be used as input for the first data fusion.

FIG. 8 shows a flowchart of a magnetic resonance imaging method 800 in another embodiment of the present invention, which includes steps 810 and 820. In step 810, one or more single signal acquisitions are performed in each of a plurality of diffusion directions, wherein a diffusion-weighted imaging sequence is performed in each single signal acquisition, in the diffusion-weighted imaging sequence, multiple excitations are employed to acquire a plurality of partial k-space data sets, and each excitation includes a pre-dephasing gradient pulse and a plurality of phase encoding gradient pulses applied after the pre-dephasing gradient pulse, and wherein the plurality of pre-dephasing gradient pulses in the multiple excitations in one or more single signal acquisitions in the plurality of diffusion directions successively have a second standard area difference A when sorted according to area values, and the second standard area difference is determined on the basis of the number of diffusion directions, the number of single signal acquisitions, and the number of excitations used in each single signal acquisition.

In step 820, data fusion processing is performed on the plurality of partial k-space data sets obtained from the one or more single signal acquisitions in the plurality of directions to obtain a magnetic resonance image.

Figure 9:
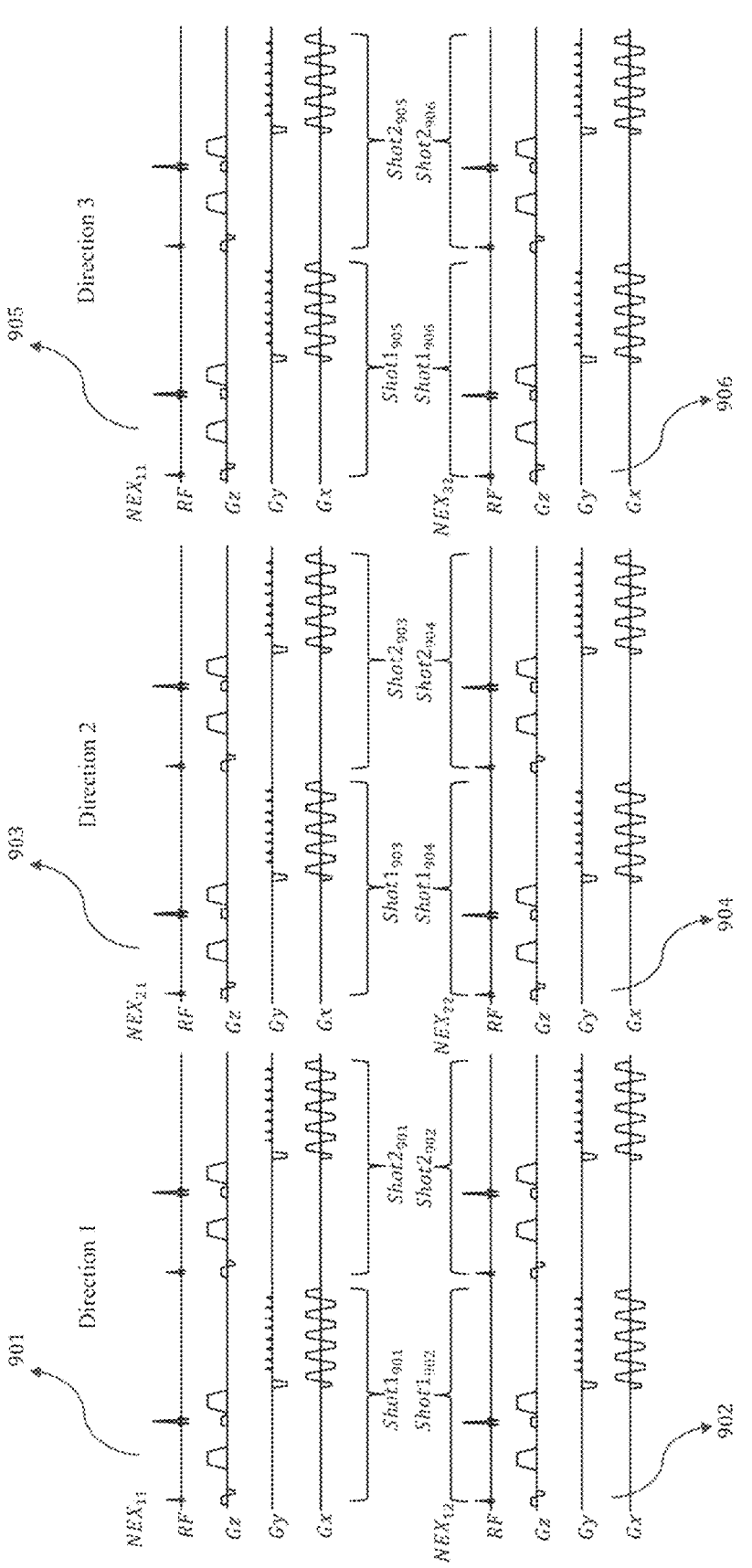
FIG. 9 shows an example of an imaging sequence applied in the method shown in FIG. 8.

FIG. 9 shows an example of an imaging sequence applied in the method 800, including diffusion-weighted imaging sequences 901, 902, 903, 904, 905, and 906, wherein the diffusion gradient pulses 911 in the sequences 901 and 902 are applied in a first gradient direction (e.g., direction 1), the sequence 901 is performed in a first single signal acquisition (e.g., $NEX_{11}$), and the sequence 902 is performed in a second single signal acquisition (e.g., $NEX_{12}$). The diffusion gradient pulses 911 in the sequences 903 and 904 are applied in a second gradient direction (e.g., direction 2), the sequence 903 is performed in the first single signal acquisition (e.g., $NEX_{21}$), and the sequence 904 is performed in the second single signal acquisition (e.g., $NEX_{22}$). The diffusion gradient pulses 911 in the sequences 905 and 906 are applied in a third gradient direction (e.g., direction 3), the sequence 905 is performed in the first single signal acquisition (e.g., $NEX_{31}$), and the sequence 906 is performed in the second single signal acquisition (e.g., $NEX_{32}$). Each of the sequences 901, 902, 903, 904, 905, and 906 has two excitations. Therefore, two single signal acquisitions in each diffusion direction have 4 excitations (4 shots). There are a total of 12 excitations in the three directions, and 12 pieces of partial k-space data are correspondingly obtained. The 12 "shots" in all of the directions are marked in sequence as Shot1$_{901}$, Shot2$_{901}$, Shot1$_{902}$, Shot2$_{902}$, Shot1$_{901}$, Shot1$_{903}$, Shot2$_{903}$, Shot1$_{904}$, Shot2$_{904}$, Shot1$_{905}$, Shot2$_{905}$, Shot1$_{906}$, and Shot2$_{906}$, respectively. When sorted according to the areas, the pre-dephasing gradient pulses 911 in the 12 "shots" successively have a second standard area difference A$_2$.

In an embodiment, the second standard area difference A$_2$ is 2/(N*M*J) of the area of any one of the plurality of phase encoding gradient pulses, where N is the number of diffusion directions, M is the number of single signal acquisitions, and J is the number of excitations in each single signal acquisition.

For the same single signal acquisition, two partial k-space data sets generated from two excitations therein may be as shown in FIG. 10, where there is a phase shift between the two partial k-space data sets, and the phase shift is determined by the second standard area difference. As shown in FIG. 10, the trajectory lines in the two partial k-space data sets 1001 and 1002 may be "inserted" sequentially to form a complete k-space data set 1003.

Further, in step 802, when data fusion processing is performed on the plurality of partial k-space data sets obtained from the one or more single signal acquisitions in the plurality of directions, first data fusion, second data fusion, and third data fusion may be included.

For example, first data fusion processing may be performed on the k-space data sets obtained in the plurality of diffusion directions. For example, this may include fusing data obtained on the basis of the sequences 901, 903, and 905, fusing data obtained on the basis of the sequences 902, 904, and 906, or fusing data obtained on the basis of the sequences 901 to 906.

As another example, the second data fusion may be performed on the k-space data sets obtained in a plurality of single signal acquisitions in any diffusion direction. For example, this may include fusing data obtained on the basis of the sequences 901 and 902, fusing data obtained on the basis of the sequences 903 and 904, and fusing data obtained on the basis of the sequences 905 and 906.

As another example, the third data fusion may be performed on a plurality of partial k-space data sets obtained in any single signal acquisition. For example, partial k-space data sets obtained on the basis of any pair of "shots" may be fused. For example, the pair of "shots" may be Shot1$_{901}$ and Shot2$_{901}$, Shot1$_{902}$ and Shot2$_{902}$, Shot1$_{903}$ and Shot2$_{903}$, Shot1$_{904}$ and Shot2$_{904}$, Shot1$_{905}$ and Shot2$_{905}$, and Shot1$_{906}$ and Shot2$_{906}$, from which the partial k-space data sets are obtained for fusion.

In an example, the data obtained by means of the third data fusion may be used as input for the second data fusion, the data obtained by means of the second data fusion may be used as input for the first data fusion, and a magnetic resonance image is finally obtained by means of the first data fusion. In some other examples, the data obtained by means of any of the first, second, and third data fusions may be used as input for the remaining two data fusion algorithms.

In the embodiments of the present invention, each of the multiple excitations of the diffusion-weighted imaging sequence employed in the method 800 is similar to the sequence 401, 402, or 403 shown in FIG. 4. In each excitation: an echo plane imaging sequence and a diffusion gradient pulse added to the echo plane imaging sequence are included, the diffusion gradient pulse includes a phase shifting gradient pulse and a re-phasing gradient pulse, the phase shifting gradient pulse and the re-phasing gradient pulse are symmetrically applied on two sides of each radio-frequency refocusing pulse of the echo plane imaging sequence, respectively, and the pre-dephasing gradient pulse is applied after the re-phasing gradient pulse.

Figure 11:
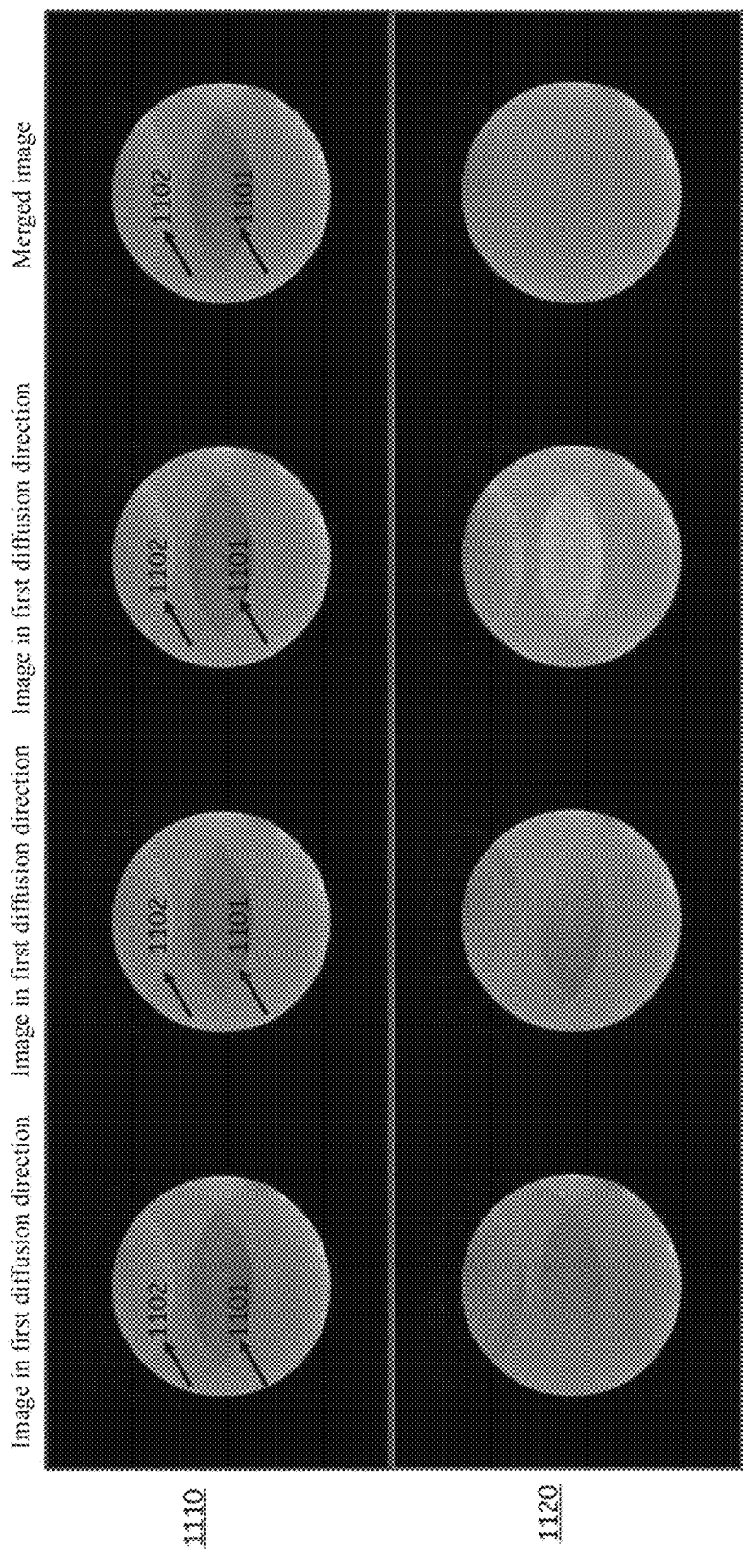
FIG. 11 is a comparison of an image obtained by a method according to an exemplary embodiment of the present invention and an image obtained by a conventional method.

With reference to FIG. 11, according to an exemplary implementation, an image obtained by a method disclosed herein is compared with an image obtained by a conventional method. An image 1110 is acquired by using the conventional method, wherein Nyquist ghosting 1101 and an acceleration artifact 1102 are clearly visible in the image. As a comparison, an image 1120 is acquired using the method according to an embodiment of the present invention, wherein in a magnetic resonance image obtained after merging image data in three directions, both Nyquist ghosting and acceleration artifacts are effectively suppressed.

Embodiments of the present invention may further provide a computer-readable storage medium including a stored computer program, where the magnetic resonance imaging method in any of the above embodiments is executed when the computer program is run.

Figure 12:
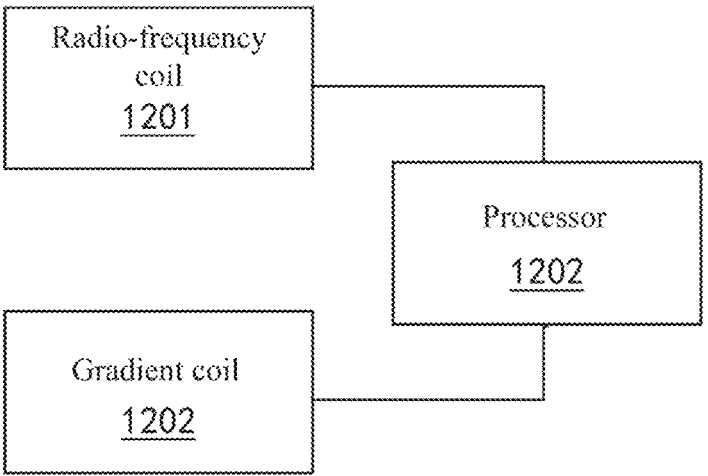
FIG. 12 shows a block diagram of a magnetic resonance imaging system according to an embodiment of the present invention.

With reference to FIG. 12, on the basis of the above description, an exemplary embodiment of the present invention may further provide a magnetic resonance imaging (MRI) system 1200, including: a gradient coil 1210 used to generate a gradient pulse; a radio-frequency coil 1220 used to generate a radio-frequency pulse; and a processor 1230 used to control the timings of the gradient coil and the radio-frequency coil to generate the gradient pulse and the radio-frequency pulse, and perform the magnetic resonance imaging method according to any one of the above embodiments.

In some embodiments, the gradient coil 1210 and the radio-frequency coil 1220 may include a gradient coil and a radio-frequency coil based on the system shown in FIG. 1, and the processor 1230 may include at least a part of the MRI system controller 130 based on the system shown in FIG. 1, and may further include at least a part of the computer system 120 based on the system shown in FIG. 1.

In an aspect, the processor 1230 is used to control the timings of the gradient coil 1210 and the radio-frequency coil 1220 to generate the gradient pulse and the radio-frequency pulse, so as to perform the following method: in a single signal acquisition, applying a plurality of diffusion-weighted imaging sequences in a plurality of diffusion directions, respectively, to acquire a plurality of k-space data sets. Each diffusion-weighted imaging sequence including a pre-dephasing gradient pulse and a plurality of phase encoding gradients applied after the pre-dephasing gradient pulse, and the pre-dephasing gradient pulses in the plurality of diffusion-weighted imaging sequences, when sorted according to area values, having a first standard area difference determined on the basis of the number of the plurality of diffusion directions.

The processor 1230 is further used to perform data fusion processing on the plurality of k-space data sets in the single signal acquisition to obtain a magnetic resonance image.

The first standard area difference is 2/N of the area of any phase encoding gradient, where N is the number of the plurality of diffusion directions.

The plurality of diffusion directions is greater than 2.

In another aspect, the processor is further used to: perform a plurality of single signal acquisitions; and perform data fusion processing on k-space data obtained from the plurality of single signal acquisitions to obtain a magnetic resonance image.

The first standard area difference is 2/(N*M) of the area of any phase encoding gradient, where N is the number of the plurality of diffusion directions, and M is the number of the single signal acquisitions.

In another aspect, each diffusion-weighted imaging sequence applied in each diffusion direction includes an echo plane imaging sequence and a diffusion gradient pulse added to the echo plane imaging sequence, the diffusion gradient pulse includes a phase shifting gradient pulse and a re-phasing gradient pulse, the phase shifting gradient pulse and the re-phasing gradient pulse are symmetrically applied on two sides of each radio-frequency refocusing pulse of the echo plane imaging sequence, respectively, and the pre-dephasing gradient pulse is applied after each of the re-phasing gradient pulses.

The first standard area difference is 2/(N*J) of the area of any phase encoding gradient, where N is the number of the plurality of diffusion directions, and J is the number of radio-frequency excitations in each echo plane sequence.

On the other hand, the processor 1230 is used to control the timings of the gradient coil 1210 and the radio-frequency coil 1220 to generate the gradient pulse and the radio-frequency pulse, so as to perform the following method: performing one or more single signal acquisitions in each of a plurality of diffusion directions. A diffusion-weighted imaging sequence is performed in each single signal acquisition, in the diffusion-weighted imaging sequence, multiple excitations are employed to acquire a plurality of partial k-space data sets, and each excitation comprises a pre-dephasing gradient pulse and a plurality of phase encoding gradient pulses applied after the pre-dephasing gradient pulse. The plurality of pre-dephasing gradient pulses in the multiple excitations of the one or more single signal acquisitions in the plurality of diffusion directions successively have a second standard area difference when sorted according to area values, and the second standard area difference is determined on the basis of the number of the diffusion directions, the number of the single signal acquisitions, and the number of excitations of the diffusion-weighted imaging sequence used in each single signal acquisition.

The processor 1230 is further used to perform data fusion processing on the plurality of partial k-space data sets obtained from the one or more single signal acquisitions in the plurality of directions to obtain a magnetic resonance image.

The second standard area difference is 2/(N*M*J) of the area of any one of the plurality of phase encoding gradient pulses, where N is the number of the diffusion directions, M is the number of the single signal acquisitions, and J is the number of excitations in each single signal acquisition.

The step of performing data fusion processing on the plurality of partial k-space data sets obtained from the one or more single signal acquisitions in the plurality of directions includes: 1) performing the first data fusion on k-space data sets obtained in the plurality of diffusion directions; 2) performing the second data fusion on k-space data sets obtained from a plurality of single signal acquisitions in any diffusion direction; and 3) performing the third data fusion on a plurality of k-space data sets obtained from any single signal acquisition.

Each of the multiple excitations of the diffusion-weighted imaging sequence includes an echo plane imaging sequence and a diffusion gradient pulse added to the echo plane imaging sequence, the diffusion gradient pulse includes a phase shifting gradient pulse and a re-phasing gradient pulse, the phase shifting gradient pulse and the re-phasing gradient pulse are symmetrically applied on two sides of each radio-frequency refocusing pulse of the echo plane imaging sequence, respectively, and the pre-dephasing gradient pulse is applied after the re-phasing gradient pulse.

In addition to any previously indicated modifications, many other variations and replacement arrangements may be devised by those skilled in the art without departing from the substance and scope of the present description, and the appended claims are intended to encompass such modifications and arrangements. Therefore, although the information has been described above in specifics and detailed terms in connection with what is currently considered to be the most practical and preferred aspects, it will be apparent to those of ordinary skill in the art that many modifications can be made, including but not limited to the form, function, mode of operation, and use, without departing from the principles and concepts set forth herein. Likewise, as used herein, in all respects, the examples and embodiments are intended to be illustrative only and should not be construed as limiting in any way.

The purpose of providing the above specific embodiments is to facilitate understanding of the content disclosed in the present invention more thoroughly and comprehensively, but the present invention is not limited to these specific embodiments. Those skilled in the art should understand that various modifications, equivalent replacements, and changes can also be made to the present invention and should be included in the scope of protection of the present invention as long as these changes do not depart from the spirit of the present invention.

The invention claimed is:

1. A magnetic resonance imaging method, the method comprising:

in a single signal acquisition, applying a plurality of diffusion-weighted imaging sequences in a plurality of diffusion directions, respectively, to acquire a plurality of k-space data sets, each diffusion-weighted imaging sequence comprising a pre-dephasing gradient pulse and a plurality of phase encoding gradient pulses applied after the pre-dephasing gradient pulse, and the pre-dephasing gradient pulses in the plurality of diffusion-weighted imaging sequences, when sorted according to area values, having a first standard area difference determined on the basis of the number of the plurality of diffusion directions; and performing data fusion processing on the plurality of k-space data sets to obtain a magnetic resonance image.

2. The method according to claim 1, wherein the first standard area difference is 2/N of the area of any phase encoding gradient pulse, where N is the number of the plurality of diffusion directions.

3. The method according to claim 1, wherein the plurality of diffusion directions is greater than 2.

4. The method according to claim 1, comprising:

performing a plurality of single signal acquisitions; and performing data fusion processing on k-space data obtained from the plurality of single-signal acquisitions to obtain a magnetic resonance image.

5. The method according to claim 4, wherein the first standard area difference is 2/(N*M) of the area of any phase encoding gradient pulse, where N is the number of the plurality of diffusion directions, and M is the number of single signal acquisitions.

6. The method according to claim 1, wherein each diffusion-weighted imaging sequence applied in each diffusion direction comprises an echo plane imaging sequence and a diffusion gradient pulse added to the echo plane imaging sequence, the diffusion gradient pulse comprises a phase shifting gradient pulse and a re-phasing gradient pulse, the phase shifting gradient pulse and the re-phasing gradient pulse are applied on two sides of each radio-frequency refocusing pulse of the echo plane imaging sequence, respectively, and the pre-dephasing gradient pulse is applied after each of the re-phasing gradient pulses.

7. The method according to claim 6, wherein the first standard area difference is 2/(N*J) of the area of any phase encoding gradient pulse, where N is the number of the plurality of diffusion directions, and J is the number of radio-frequency excitations in each echo plane sequence.

8. A magnetic resonance imaging system, comprising:
a gradient coil used to generate a gradient pulse;
a radio-frequency coil used to generate a radio-frequency pulse; and
a processor used to control timings of the gradient coil and the radio-frequency coil generating the gradient pulse and the radio-frequency pulse, and perform the magnetic resonance imaging method according to claim 1.

9. A magnetic resonance imaging method, the method comprising:
performing one or more single signal acquisitions in each of a plurality of diffusion directions, wherein a diffusion-weighted imaging sequence is performed in each single signal acquisition, in the diffusion-weighted imaging sequence, multiple excitations are employed to acquire a plurality of partial k-space data sets, and each excitation comprises a pre-dephasing gradient pulse and a plurality of phase encoding gradient pulses applied after the pre-dephasing gradient pulse, and wherein the plurality of pre-dephasing gradient pulses in the multiple excitations of the one or more single signal acquisitions in the plurality of diffusion directions successively have a second standard area difference when sorted according to area values, and the second standard area difference is determined on the basis of the number of diffusion directions, the number of single signal acquisitions, and the number of excitations of the diffusion-weighted imaging sequence used in each single signal acquisition; and
performing data fusion processing on the plurality of partial k-space data sets obtained from the one or more single signal acquisitions in the plurality of directions to obtain a magnetic resonance image.

10. The method according to claim 9, wherein the second standard area difference is 2/(N*M*J) of the area of any one of the plurality of phase encoding gradient pulses, where N is the number of diffusion directions, M is the number of single signal acquisitions, and J is the number of excitations in each single signal acquisition.

11. The method according to claim 9, wherein the step of performing data fusion processing on the plurality of partial k-space data sets obtained from the one or more single signal acquisitions in the plurality of directions comprises:
performing first data fusion on k-space data sets obtained in the plurality of diffusion directions;
performing second data fusion on k-space data sets obtained from a plurality of single signal acquisitions in any diffusion direction; and
performing third data fusion on a plurality of k-space data sets obtained from any single signal acquisition.

12. The method according to claim 9, wherein each of the multiple excitations of the diffusion-weighted imaging sequence comprises an echo plane imaging sequence and a diffusion gradient pulse added to the echo plane imaging sequence, the diffusion gradient pulse comprises a phase shifting gradient pulse and a re-phasing gradient pulse, the phase shifting gradient pulse and the re-phasing gradient pulse are applied on two sides of each radio-frequency refocusing pulse of the echo plane imaging sequence, respectively, and the pre-dephasing gradient pulse is applied after the re-phasing gradient pulse.

* * * * *